(12) United States Patent
Cho et al.

(10) Patent No.: US 6,908,805 B2
(45) Date of Patent: Jun. 21, 2005

(54) METHOD OF MANUFACTURING DUAL GATE OXIDE FILM

(75) Inventors: Jung Il Cho, Yongin (KR); Seung Cheol Lee, Ichon (KR); Sang Wook Park, Seoul (KR)

(73) Assignee: Hynix Semiconductor Inc. (KR)

( * ) Notice: Subject to any disclaimer, the term of this patent is extended or adjusted under 35 U.S.C. 154(b) by 28 days.

(21) Appl. No.: 10/739,649

(22) Filed: Dec. 18, 2003

(65) Prior Publication Data

US 2004/0253780 A1 Dec. 16, 2004

(30) Foreign Application Priority Data

Jun. 13, 2003 (KR) .................................. 10-2003-0038233

(51) Int. Cl.$^7$ ......................................... H01L 21/8238
(52) U.S. Cl. ........................ 438/213; 438/283; 438/378
(58) Field of Search ................................. 438/213, 283, 438/335, 367, 373, 378

(56) References Cited

U.S. PATENT DOCUMENTS

| | | | | |
|---|---|---|---|---|
| 6,037,224 A | * | 3/2000 | Buller et al. | 438/258 |
| 6,261,972 B1 | | 7/2001 | Tews et al. | 438/766 |
| 6,642,156 B2 | * | 11/2003 | Gousev et al. | 438/786 |
| 6,784,060 B2 | * | 8/2004 | Ryoo | 438/275 |

* cited by examiner

*Primary Examiner*—Phuc T. Dang
(74) *Attorney, Agent, or Firm*—Marshall, Gerstein & Borun LLP

(57) ABSTRACT

The present invention is provided to manufacture a dual gate oxide film. According to the present invention, it is possible to obtain a high-quality NO gate oxide film for high voltage and a high-quality NO gate oxide film for low voltage where nitrogen is distributed uniformly in the entire oxide films by carrying out a rapid annealing process in an inert atmosphere after carrying out an NO annealing process in order to prevent a phenomenon that nitrogen is not distributed uniformly and segregated in a gate oxide film for high voltage due to application of the NO annealing process after forming a gate oxide film for low voltage.

9 Claims, 2 Drawing Sheets

METHOD OF MANUFACTURING DUAL GATE OXIDE FILM

BACKGROUND

1. Field of the Invention

The present invention relates to a method of manufacturing a dual gate oxide film and, more specifically to a method of manufacturing a dual gate oxide film capable of preventing film quality of a gate oxide film for high voltage from being deteriorated due to application of an NO annealing process.

2. Discussion of Related Art

In general, a technology for integrally implementing elements having different transconductances on a chip has been proposed, and such technology has been adapted to embody low-voltage driving elements and high-voltage driving elements.

When the high-voltage driving elements and the low-voltage driving elements were embodied simultaneously, an oxidation process was carried out two times to form a thick gate oxide film for high voltage and a thin gate oxide film for low voltage.

However, the low-voltage driving elements have required a high gate capacitance in order to maintain a stable element performance with a low driving voltage. In this regard, a technology for nitrifying gate oxide films of the low-voltage driving elements by using a Nitrogen-Oxygen (NO) annealing process in order to increase a dielectric constant has been studied.

As described above, dual gate oxide films of the high-voltage driving elements and the low-voltage driving elements to which the NO annealing process was introduced have been applied to various semiconductor devices, such as a DRAM, a SRAM, a NAND Flash, etc.

FIG. 1 is a cross-sectional view of an element illustrating a conventional method of manufacturing a dual gate oxide film.

Referring to FIG. 1, a semiconductor substrate 11 in which a high-voltage driving element region (HV) and a low-voltage driving element region (LV) are defined is provided. A first gate oxide film 12 is formed on a surface of the semiconductor substrate 11 in the high-voltage driving element region (HV) to be thick, e.g., with a thickness of about 350 Å, and a second gate oxide film 13 is formed on a surface of the semiconductor substrate 11 in the low-voltage driving element region (LV), including a surface of the first gate oxide film 12, to be thin, e.g., with a thickness of about 80 Å. Then, an NO annealing process is carried out thereto.

Because only the second gate oxide film 13 is formed in the low-voltage driving element region (LV) and the second gate oxide film 13 has a thin thickness, nitrogen fully diffuses up to the semiconductor substrate 11 during the NO annealing process, and thus, as shown in dotted line, nitrogen trap (NT) is formed to be homogeneous over the entire oxide film. As a result, a good quality NO gate oxide film for low voltage 13N is formed through nitrification of the second gate oxide film 13.

Because the first gate oxide film 12 and the second gate oxide film 13 are laminated in the high-voltage driving element region (HV) and the laminated gate oxide films 12 and 13 are thick, nitrogen does not fully diffuse up to the semiconductor substrate 11 during the NO annealing process, and thus, as shown in a dotted line, a nitrogen trap (NT) is formed not to be homogeneous over the entire oxide film. Moreover, when a cleaning process is carried out before forming the second gate oxide film 13, a portion of the first gate oxide film 12 can be recessed. In this state, when an oxidation process for forming the second gate oxide film 13 is carried out, an oxide is re-grown in the recessed portion, and then, Si—O—N bonding is formed through the NO annealing process. At that time, a nitrogen segregation phenomenon occurs in regions of the first gate oxide film 12, the regions being subjected to chemical attacks during the cleaning process, and thus Si—O—N defects (NS) are formed on a surface thereof. As a result, although the NO gate oxide film for high voltage 12N is formed through nitrification of the first and second gate oxide films 12 and 13, it is not possible to obtain a good-quality film.

As described above, when the NO gate oxide film for high voltage 12N and the NO gate oxide film for low voltage 13N are formed using the conventional method of manufacturing a dual gate oxide film, there occurs a problem that the film quality of the NO gate oxide film for high voltage 12N is deteriorated due to the nitrogen segregation phenomenon.

SUMMARY OF THE INVENTION

The present invention is directed to a method of manufacturing a dual gate oxide film, capable of improving electrical characteristic and reliability of a device by using an NO annealing process to prevent a film quality of a gate oxide film for high voltage from being deteriorated.

According to an embodiment of the present invention, there is provided a method of manufacturing a dual gate oxide film, comprising the steps of: forming a first gate oxide film having a first thickness on a semiconductor substrate in which a high-voltage driving element region and a low-voltage driving element region are defined; leaving the first gate oxide film only on the semiconductor substrate of the high-voltage driving element region; forming a second gate oxide film having a thickness less than the first thickness on the semiconductor substrate of the low-voltage driving element region including the first gate oxide film; carrying out an NO annealing process to diffuse nitrogen into the first and the second gate oxide films; and carrying out a rapid annealing process to distribute the nitrogen uniformly in the first and the second gate oxide films, thereby forming an NO gate oxide film for a high voltage and an NO gate oxide film for low voltage.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Hereinafter, preferred embodiments of the present invention will be described with reference to the accompanying drawings. However, the present invention is not limited to the embodiments described below, and can be embodied in various aspects. Further, the embodiments are provided to fully disclose the present invention and to inform those skilled in the art of the scope of the invention.

FIGS. 2A to 2E are cross-sectional views of an element illustrating a method of manufacturing dual gate oxide film according to an embodiment of the present invention.

Figure 1:
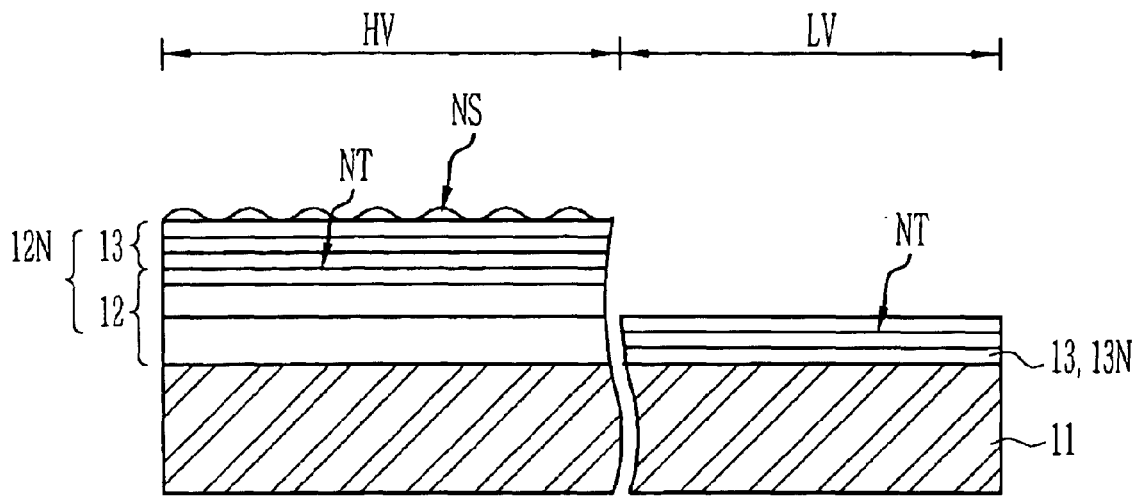
FIG. 1 is a cross-sectional view of an element illustrating a conventional method of manufacturing a dual gate oxide film.
Figure 2A:
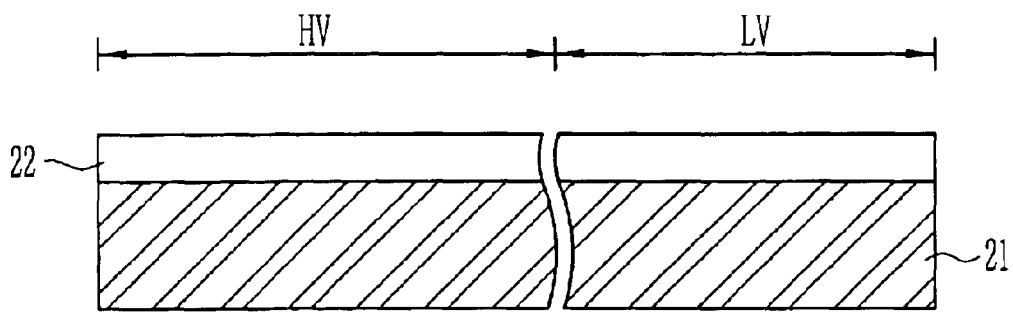
FIGS. 2A to 2E are cross-sectional views of an element illustrating a method of manufacturing a dual gate oxide film according to an embodiment of the present invention.

Referring to FIG. 2A, a first gate oxide film 22 is formed on a semiconductor substrate 21, in which a high-voltage driving element region (HV) and a low-voltage driving element region (LV) are defined, to have a first thickness.

The first gate oxide film 22 is used for a high voltage and can be formed using two methods. The first method is that the first gate oxide film is formed using pure oxide at an oxidation temperature of 750 to 850° C. to have a thickness of 300 to 500 Å. The second method is that the first gate oxide film is formed using an $H_2/O_2/N_2$ gas at an oxidation temperature of 750 to 850° C. to have a thickness of 300 to 500 Å, and then an $N_2$ annealing process is carried out.

Figure 2B:
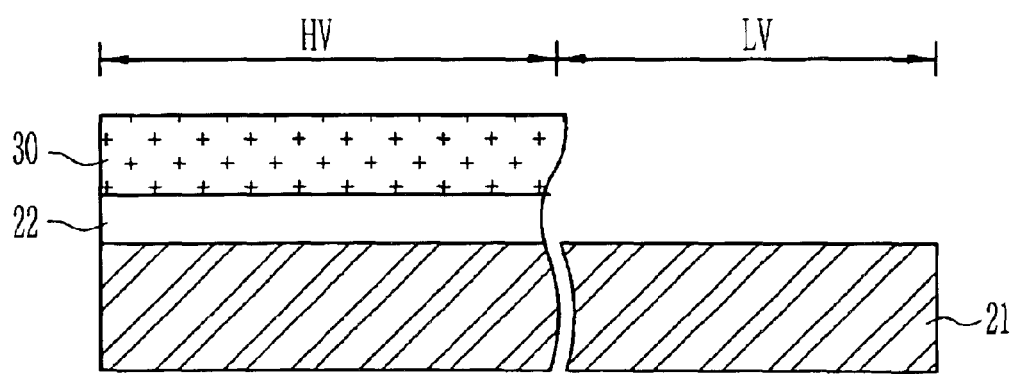

Referring to FIG. 2B, a photoresist pattern 30 is formed on the first gate oxide film 22 to open a portion excluding the high-voltage driving element region (HV). An exposed portion of the first gate oxide film 22 is removed using the photoresist pattern 30 as an etching mask, and thus the first gate oxide film 22 remains only on the semiconductor substrate 21 in which the high-voltage driving element region (HV) is defined.

The photoresist pattern 30 will be used in a subsequent etching process as an etch mask, and is formed to have a thickness of 1.0 to 1.5 $\mu$m. In order to completely remove the exposed portion of the first gate oxide film 22, the etching process is carried out in a condition that an etch target is in the range of 350 to 700 Å and then an over-etch target is 30 to 100%. To enhance stability of the etching process, it is preferable that a descum process is carried out in the $O_2$ plasma method for 5 to 20 minutes so as to remove scrum on an interface of the photoresist pattern 30, and then the etching process is carried out.

Figure 2C:
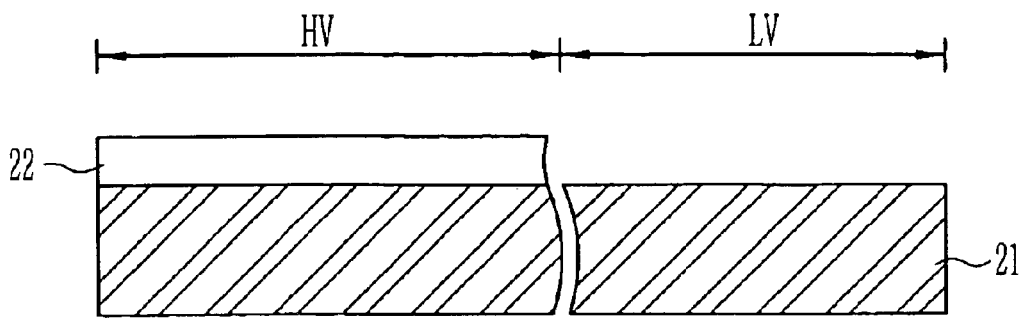

Referring to FIG. 2C, the first gate oxide film 22 remains only on the high-voltage driving element region (HV) through a photoresist pattern 30 stripping process and a first cleaning process.

On the other hand, an etching process for removing the first gate oxide film 22 can be carried out by sequentially carrying out a step of etching the first gate oxide film 22, a step of stripping the photoresist pattern 30, and a step of performing the first cleaning process, or by carrying out those steps in-situ simultaneously.

Figure 2D:
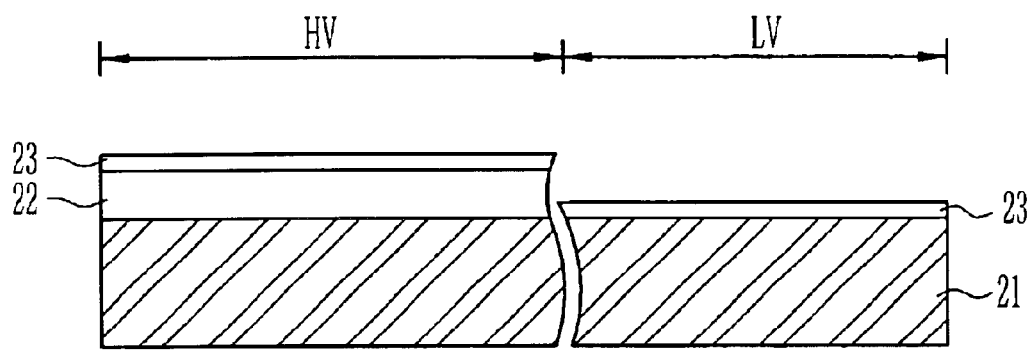

Referring to FIG. 2D, after a second cleaning process, a second gate oxide film 23 is formed on the semiconductor substrate 21 of the low-voltage driving element region (LC), including the first gate oxide film 22, to have a thickness less than the first thickness.

The second cleaning process may be called an oxidation pre cleaning which is carried out before forming the second gate oxide film 23. Such oxidation pre-cleaning process is performed for 30 to 100 seconds, wherein the recipe is composed of 50:1 to 100:1 (HF:$H_2O$) HF+N (NH$_4$OH:$H_2O_2$:$H_2O$=1:4:20, 25° C.). When the oxidation pre cleaning process is carried out, a surface of the first gate oxide film in the high-voltage driving element region (HV) may be recessed. Thus, the oxidation pre cleaning process may be carried out in the 100:1 to 300:1 BOE cleaning manner so as to enhance roughness of the recessed surface. It is preferable that, when the oxidation pre cleaning process is carried out, the recess amount of the first gate oxide film 22 is made to be uniform over the entire surface by eliminating variation of etch rate.

The second gate oxide film 23 can be used for a low voltage and a high voltage, and is formed using pure oxide at an oxidation temperature of 750 to 850° C. to have a thickness of 60 to 100 Å.

Figure 2E:
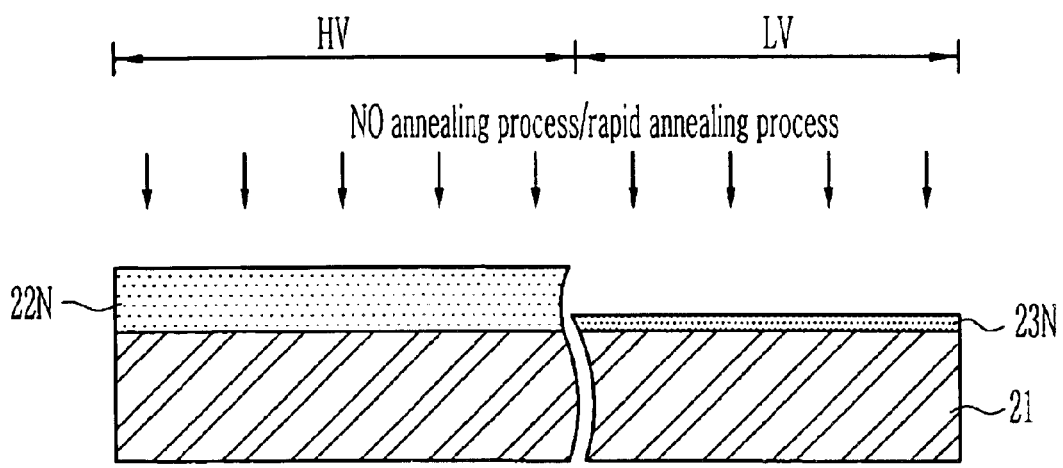

Referring to FIG. 2E, in the state that the first and second gate oxide films 22 and 23 are laminated in the high-voltage driving element region (HV) and the second gate oxide film 23 is formed only in the low-voltage driving element region (LV), the NO annealing process is carried out in-situ. Nitrogen may diffuse into the gate oxide films 22 and 23 during the NO annealing process, and then a nitrogen trap is formed to be homogeneous in the second gate oxide film 23 in the low-voltage driving element region (LV). However, the nitrogen trap is formed not to be homogeneous in the laminated first and second gate oxide films 22 and 23 in the high-voltage driving element region (HV), and in addition, a nitrogen segregation phenomenon occurs on the surface, thereby causing Si—O—N type defects. Accordingly, a rapid annealing (RTP anneal) process is carried out to make nitrogen homogeneous as a whole. The rapid annealing process is carried out at a temperature of 500 to 700° C. for 15 to 50 seconds in an inert atmosphere of argon, in which thermal budget can be minimized. Nitrogen segregated in the surface diffuses up to the semiconductor substrate 21 during the rapid annealing process, so that the Si—O—N type defects disappear from the high-voltage driving element region (HV) and the nitrogen trap comes to uniform entirely.

By using the NO annealing process and the rapid annealing process, a good-quality NO gate oxide film for low voltage 23N is formed in the low-voltage driving element region (LV) through nitrification of the second gate oxide film 23, and a good-quality NO gate oxide film for high voltage 22N is formed in the high-voltage driving element region (HV) through nitrification of the first and second gate oxide films 22 and 23.

As described above, according to the present invention, it is possible to remove defect sources by carrying out the rapid annealing process in the inert atmosphere to diffuse nitrogen segregated on the surface of the gate oxide film in the high-voltage driving element region up to the semiconductor substrate and thus to make distribution of nitrogen uniform, and in addition, it is also possible to improve characteristics of the gate oxide film of the high-voltage driving element and thus to improve electrical characteristic and reliability of a device.

What is claimed is:

1. A method of manufacturing a dual gate oxide film, comprising the steps of:
   forming a first gate oxide film having a first thickness on a semiconductor substrate in which a high-voltage driving element region and a low-voltage driving element region are defined;
   leaving the first gate oxide film only on the semiconductor substrate of the high-voltage driving element region;
   forming a second gate oxide film having a thickness less than the first thickness on the semiconductor substrate of the low-voltage driving element region including the first gate oxide film;
   carrying out an NO annealing process to diffuse nitrogen into the first and the second gate oxide films; and
   carrying out a rapid annealing process to distribute the nitrogen uniformly in the first and the second gate oxide films, thereby forming an NO gate oxide film for a high voltage and an NO gate oxide film for a low voltage.

2. The method of manufacturing a dual gate oxide film according to claim 1, wherein the first gate oxide film is formed using a pure oxide at an oxidation temperature of 750° C. to 850° C. to have a thickness of 300 Å to 500 Å.

3. The method of manufacturing a dual gate oxide film according to claim 1, wherein the first gate oxide film is formed using an $H_2/O_2/N_2$ gas at an oxidation temperature of 750° C. to 850° C. to have a thickness of 300 Å to 500 Å, and then an $N_2$ annealing process is carried out thereto.

4. The method of manufacturing a dual gate oxide film according to claim 1, wherein the second gate oxide film is formed using a pure oxide at an oxidation temperature of 750° C. to 850° C. to have a thickness of 60 Å to 100 Å.

5. The method of manufacturing a dual gate oxide film according to claim 1, further comprising a step of carrying out an oxidation pre-cleaning process before the step of forming the second gate oxide film.

6. The method of manufacturing a dual gate oxide film according to claim 5, wherein the oxidation pre-cleaning process is performed for 30 to 100 seconds, and a recipe thereof is composed of 50:1 to 100:1 ($HF:H_2O$) HF+N ($NH_4OH:H_2O_2:H_2O$=1:4:20,25° C.).

7. The method of manufacturing a dual gate oxide film according to claim 5, wherein the oxidation pre-cleaning process is carried out using a 100:1 to 300:1 BOE cleaning method.

8. The method of manufacturing a dual gate oxide film according to claim 1, wherein the NO annealing process is carried out in-situ after the step of forming the second gate oxide film.

9. The method of manufacturing a dual gate oxide film according to claim 1, wherein the rapid annealing process is carried out at a temperature of 500 ° C. to 700°C. for 15 to 50 seconds, in an inert atmosphere of argon.

* * * * *

UNITED STATES PATENT AND TRADEMARK OFFICE
CERTIFICATE OF CORRECTION

PATENT NO. : 6,908,805 B2
DATED : June 21, 2005
INVENTOR(S) : Lee et al.

It is certified that error appears in the above-identified patent and that said Letters Patent is hereby corrected as shown below:

Title page,
Item [75], Inventors, delete "Yongin" and insert -- Kyungki-Do --; and delete "Ichon" and insert -- Kyungki-Do --.
Item [73], Assignee, delete "Hynix Semiconductor Inc. (KR)" and insert -- Hynix Semiconductor Inc., Kyungki-Do (KR) --.

Signed and Sealed this

Twenty-seventh Day of September, 2005

JON W. DUDAS
*Director of the United States Patent and Trademark Office*